United States Patent
Higuchi et al.

(10) Patent No.: US 12,163,917 B2
(45) Date of Patent: Dec. 10, 2024

(54) SENSOR SYSTEM, AND SENSOR SYSTEM FAILURE DETECTING METHOD

(71) Applicant: NGK SPARK PLUG CO., LTD., Nagoya (JP)

(72) Inventors: Yuzo Higuchi, Nagoya (JP); Yuji Oi, Nagoya (JP); Satoru Toda, Nagoya (JP); Satoru Abe, Nagoya (JP); Junichiro Mitsuno, Nagoya (JP); Hidetoshi Makino, Nagoya (JP)

(73) Assignee: NITERRA CO., LTD., Nagoya (JP)

( * ) Notice: Subject to any disclaimer, the term of this patent is extended or adjusted under 35 U.S.C. 154(b) by 528 days.

(21) Appl. No.: 17/630,209

(22) PCT Filed: Oct. 8, 2020

(86) PCT No.: PCT/JP2020/038158
§ 371 (c)(1),
(2) Date: Jan. 26, 2022

(87) PCT Pub. No.: WO2021/075351
PCT Pub. Date: Apr. 22, 2021

(65) Prior Publication Data
US 2022/0283115 A1 Sep. 8, 2022

(30) Foreign Application Priority Data
Oct. 15, 2019 (JP) ................. 2019-189002

(51) Int. Cl.
*H03M 1/10* (2006.01)
*G01M 15/10* (2006.01)
(Continued)

(52) U.S. Cl.
CPC ........ *G01N 27/419* (2013.01); *G01M 15/104* (2013.01); *G01R 19/252* (2013.01); *G01R 31/2829* (2013.01); *H03M 1/1076* (2013.01)

(58) Field of Classification Search
CPC .............. H03M 1/1076; H03M 1/1071; G01R 19/252; G01R 31/2829
(Continued)

(56) References Cited

U.S. PATENT DOCUMENTS 4,888,548 A  12/1989 Chism
2002/0162743 A1  11/2002 Inagaki
(Continued)

FOREIGN PATENT DOCUMENTS

JP  2-012075 A  1/1990
JP  11-304758 A  11/1999
(Continued)

OTHER PUBLICATIONS

Communication dated Dec. 27, 2023 issued by the Indian Patent Office in Indian Application No. 202217001539.
(Continued)

*Primary Examiner* — Peguy Jean Pierre
(74) *Attorney, Agent, or Firm* — Sughrue Mion, PLLC

(57) ABSTRACT

A sensor system (1, 1S) including a current DA converter (42) outputting a control current (Ip) of a sensor element (3S), a control unit (4C) generating a control current instruction value (Ipcmd) corresponding to magnitude of the control current and inputting this instruction value to the current DAC, an instruction value sequence generating unit (47) generating, instead of the control current instruction value, an inspection instruction value sequence (RChcmd) in which predetermined inspection current instruction values (Chcmd) inputted to the current DAC are arranged in order and by which failure of the current DAC can be detected, an inspection current detection unit (71) detecting an inspection current value (Ichv) of an inspection current (Ich) outputted from the current DAC, and a failure detection unit (8) detecting failure of the current DAC from an inspection current value sequence (RIchv) in which the inspection current values are arranged in order of detection.

8 Claims, 6 Drawing Sheets

(51) Int. Cl.
  *G01N 27/419* (2006.01)
  *G01R 19/252* (2006.01)
  *G01R 31/28* (2006.01)
(58) Field of Classification Search
  USPC ............................. 341/144, 155, 120, 188
  See application file for complete search history.

(56) References Cited

U.S. PATENT DOCUMENTS

| | | | |
|---|---|---|---|
| 2013/0307460 A1* | 11/2013 | Tsuchihashi | H02P 8/36 |
| | | | 318/696 |
| 2016/0097738 A1 | 4/2016 | Higuchi et al. | |
| 2017/0184658 A1* | 6/2017 | Uemura | H01L 25/0655 |
| 2018/0306136 A1 | 10/2018 | Mitsuno et al. | |

FOREIGN PATENT DOCUMENTS

| | | |
|---|---|---|
| JP | 2000-266821 A | 9/2000 |
| JP | 2001-255334 A | 9/2001 |
| JP | 2016-070882 A | 5/2016 |
| JP | 2018-185163 A | 11/2018 |
| JP | 2019-074360 A | 5/2019 |

OTHER PUBLICATIONS

International Search Report for PCT/JP2020/038158 dated Nov. 10, 2020 [PCT/ISA/210].
Office Action dated Aug. 25, 2022 from the Intellectual Property Office of India in IN Application No. 202217001539.

* cited by examiner

SENSOR SYSTEM, AND SENSOR SYSTEM FAILURE DETECTING METHOD

CROSS REFERENCE TO RELATED APPLICATIONS

This application is a National Stage of International Application No. PCT/JP2020/038158 filed Oct. 8, 2020, claiming priority to Japanese Patent Application No. 2019-189002 filed Oct. 15, 2019.

TECHNICAL FIELD

The present invention relates to a sensor system having a current DA converter that outputs a control current toward a sensor element and a control unit that generates a control current instruction value corresponding to magnitude of the control current and inputs the control current instruction value to the current DA converter, and relates to a failure detecting method of the sensor system.

BACKGROUND ART

There are known an air-fuel ratio sensor system that is mounted in a vehicle etc. and detects an air-fuel ratio of an internal combustion engine by detecting an oxygen concentration of exhaust gas and a NOx sensor system that is mounted in a vehicle etc. and detects a NOx gas concentration in exhaust gas. Further, there are known an air-fuel ratio sensor system mounted in a vehicle etc. and detecting an air-fuel ratio of an internal combustion engine by detecting an oxygen concentration of exhaust gas using a gas sensor element having two cells of an oxygen pump cell and an oxygen concentration detection cell and a NOx sensor system mounted in a vehicle etc. using a gas sensor element having three cells of the above two cells and a cell for detecting a NOx gas concentration.

In such sensor systems, some of them are types of the sensor system which, for ease of processing, digitize control that is conventionally performed using an analog circuit, generate a control current instruction value in or by a control unit, convert the control current instruction value into a control current in or by a current DA converter, and input the control current to a sensor element. As an example of such sensor systems, for instance, it is a gas sensor system disclosed in Patent Document 1 and so on. Here, in such sensor systems, when intending to get magnitude of the control current inputted from the current DA converter to the sensor element, the control current instruction value that is a digital value is used with this control current instruction value regarded as the magnitude of the control current without measuring the actually flowing control current. For instance, the magnitude of the control current and this control current instruction value are transmitted to an ECU etc. This is because the magnitude of the control current outputted from the current DA converter (hereinafter also called a current DAC) corresponds to the control current instruction value inputted to this current DAC.

Here, the current DAC is a type of a DA converter that outputs a current value corresponding to a binary value (a binary code: example: a 14-bit signed integer) of the number of inputted predetermined bits (e.g. 14 bits). Further, at an output stage of the current DAC, a current source(s) weighted according to the bit and switching elements (FETs, transistors, etc.), the numbers of which correspond to a bit depth (the number of bits) of the current DAC, are connected in parallel. Therefore, for instance, in a case of the current DAC of a 12-bit unsigned integer, 12 switching elements (12-pair switching elements) are provided in parallel at the output stage. In a case of the current DAC of a 14-bit signed integer, 26 switching elements (13-pairs at a plus side and 13-pairs at a minus side) are provided in parallel at the output stage.

CITATION LIST

Patent Document

Patent Document 1: Japanese Unexamined Patent Application Publication No. JP2016-070882

SUMMARY OF THE INVENTION

Technical Problem

Here, there may be a case where any of the switching elements forming the output stage of the current DAC fails. More specifically, there is a case where a malfunction (hereinafter called "on-failure") in which any of the switching elements corresponding to the respective bits of the output stage is normally turned on occurs or a malfunction (hereinafter called "off-failure") in which any of the switching elements corresponding to the respective bits of the output stage is normally turned off occurs. In this case, the control current outputted from the current DAC may become an abnormal value by an amount of magnitude corresponding to a bit (a digit) that corresponds to the failed switching element. For instance, a case of the current DAC of a 4-bit unsigned integer will be described below.

For instance, in a case where the control current instruction values are inputted in order of (0000), (0010) and (1110), if there is no failure in the current DAC, the magnitudes of the outputted control currents are "0, 2 and 14" respectively. However, for instance, if the on-failure occurs at the switching element that corresponds to a 3rd bit from below, the current DAC behaves as if the control current instruction values are inputted in order of (0100), (0110) and (1110). That is, the magnitudes of the outputted control currents are "4, 6 and 14" respectively. Here, in the case where a code (e.g. the above (1110)) whose 3rd bit from below, which has failed, is "1" is inputted, it looks as if a correct control current is outputted. On the other hand, if the off-failure occurs, this is an opposite to the above on-failure, and the current DAC behaves as if the control current instruction values are inputted in order of (0000), (0010) and (1010). That is, the magnitudes of the outputted control currents are "0, 2 and 10" respectively.

In the sensor system disclosed in Patent Document 1, however, even if any of the switching elements forming the output stage of the current DA converter fails (hereinafter, the on-failure and the off-failure are collectively called a bit failure), the sensor system cannot detect this failure. This is because the control current instruction value inputted to the current DAC and transmitted to the ECU etc. is a normal value.

The present technique was made in view of the above technical problem. The present technique provides a sensor system having a sensor element, a current DA converter that outputs a control current toward the sensor element and a control unit that generates a control current instruction value and inputs the control current instruction value to the current DA converter and a failure detecting method of the sensor system, which are capable of detecting a failure of the current DA converter.

Solution to Problem

According to one aspect of the present technique, a sensor system comprises: a current DA converter configured to output a control current toward a sensor element; a control unit configured to generate a control current instruction value corresponding to magnitude of the control current and input the control current instruction value to the current DA converter; an instruction value sequence generating unit configured to generate, instead of the control current instruction value generated by the control unit, an inspection instruction value sequence in which predetermined inspection current instruction values inputted to the current DA converter are arranged in order and by which failure of the current DA converter can be detected; an inspection current detection unit configured to detect an inspection current value of an inspection current that is outputted from the current DA converter sequentially inputting the inspection current instruction value forming the inspection instruction value sequence; and a failure detection unit configured to detect the failure of the current DA converter from an inspection current value sequence in which the inspection current values detected by the inspection current detection unit are arranged in order of detection.

According to another aspect of the present technique, a method of detecting failure of a sensor system, the sensor system having a current DA converter configured to output a control current toward a sensor element and a control unit configured to generate a control current instruction value corresponding to magnitude of the control current and input the control current instruction value to the current DA converter, the method comprises: generating an inspection instruction value sequence in which predetermined inspection current instruction values are arranged in order and by which failure of the current DA converter can be detected; sequentially inputting, instead of the control current instruction value generated by the control unit, the inspection current instruction value forming the inspection instruction value sequence to the current DA converter; detecting an inspection current value of an inspection current that is outputted from the current DA converter; and detecting the failure of the current DA converter from an inspection current value sequence in which the detected inspection current values are arranged in order of detection.

In the above sensor system, instead of the control current instruction value, a sequence of the inspection current instruction value which is generated by the instruction value sequence generating unit and by which the failure of the current DAC can be detected is inputted to the current DAC that normally inputs the control current instruction value. The inspection current is then outputted in accordance with this input, and the inspection current detection unit actually detects a value of this inspection current. From the inspection current value sequence in which the inspection current values obtained are arranged in order of detection, the failure of the current DAC, such as the presence or absence of the bit failure of the current DAC and determination or localization of the failed bit, can be detected. A proper operation using the sensor system having no failure can therefore be possible.

As for the method of detecting failure of the sensor system, the inspection instruction value sequence by which the failure of the current DAC can be detected is inputted to the current DAC, and the inspection current value is actually obtained from the outputted inspection current. Then, from the inspection current value sequence in which the inspection current values are arranged in order of detection, the bit failure of the current DAC is detected. It is therefore possible to surely detect the bit failure of the current DAC in the sensor system.

Here, as "the inspection instruction value sequence by which the failure of the current DA converter can be detected", for instance, it is an inspection instruction value sequence of (000000000000), (000000000001), (000000000010), . . . , (111111111111) which makes the inspection current instruction value increase by 1 LSB from a lower limit value to an upper limit value (e.g. in a case of 12 bit, from (000000000000) to (111111111111)), or a plurality of sets of the inspection current instruction value which are suitable for the detection of the failure of a specific bit. Further, as a detection manner of the failure in or by the failure detection unit, it could be a manner that judges the failure according to whether a variation of adjacent inspection current values in the inspection current value sequence in which the inspection current values actually obtained are arranged is greater than a predicted variation or smaller than the predicted variation. Furthermore, it may be a manner that judges the failure by a comparison between the inspection current value sequence in which the inspection current values actually obtained are arranged and a predicted inspect ion current value sequence in which inspection current values predicted when the current DAC is normal are arranged.

Further, to detect the inspection current value of the inspection current in or by the inspection current detection unit, it is preferable to obtain the inspection current value by reading, by an AD converter, a voltage produced at a current conversion resistance through which the inspection current passes. Here, it is preferable that resolution (resolving power) (size of 1 LSB, the number of bits) of the inspection current that this AD converter detects be the same as or smaller than resolution (resolving power) (size of 1 LSB, the number of bits) of the inspection current that the current DAC outputs (the number of bits of this AD converter be the same or greater than the number of bits of the current DAC). On the other hand, if the resolving power (the number of bits) of the AD converter is greater than the resolving power (the number of bits) of the current DAC (if the number of bits of the AD converter is smaller than the number of bits of the current DAC), the failure detection of only a part (e.g. a higher-order bit) of bits of the output stage of the current DAC is possible. It is noted that the sensor system includes a sensor system having the sensor element that inputs the control current from the AD converter and a sensor system having no sensor element (i.e. the sensor element is provided outside the sensor system).

The above sensor system could be a sensor system in which the inspection instruction value sequence is a sequence of the inspection current instruction value changing by 1 LSB in order within a range of the inspection current instruction value that can be inputted to the current DA converter.

The method of detecting failure of the sensor system could be a method of detecting failure of the sensor system in which the generated inspection instruction value sequence is a sequence of the inspection current instruction value changing by 1 LSB in order within a range of the inspection current instruction value that can be inputted to the current DA converter.

In this sensor system and this failure detecting method of the sensor system, as the inspection instruction value sequence by which the failure of the current DA converter can be detected, the sequence of the inspection current instruction value changing by 1 LSB in order is used. For instance, in a case of 12 bit, it is an inspection instruction value sequence of (000000000000), (000000000001), (000000000010), . . . , (111111111111) which makes the inspection current instruction value increase by 1 LSB from (000000000000) to (111111111111). In this case, if there is no failure in the current DAC, a value of the inspection current outputted from the current DA converter also changes gradually and monotonously toward an upper limit value or a lower limit value within a range of the inspection current.

However, if the on-failure occurs at any (e.g. a 3rd bit) of the bits of the output stage of the current DA converter, a switching element of the on-failed bit (e.g. the 3rd bit) remains on, including when the switching element should be off. Because of this, when the inspection current instruction value by which the switching element should be originally turned on is inputted to the switching element of the failed bit (e.g. the 3rd bit), it looks as if the current DAC passes a normal-sized inspection current (the inspection current having normal magnitude). However, subsequently, even if the inspection current instruction value is sequentially updated and the switching element of the failed bit (e.g. the 3rd bit) should be originally turned off, the switching element remains on. In this case, the inspection current whose magnitude is greater than the inspection current having the normal magnitude flows. Further, after that, again, when the switching element of the failed bit (e.g. the 3rd bit) should be originally switched to "on", it looks as if the current DAC passes the inspection current having the normal magnitude, again. That is, unlike the case where no failure occurs at the current DAC, the inspection current value does not change monotonously, but greatly changes due to a certain inspection current instruction value corresponding to the failed bit. Likewise, in the case of the off-failure, when the switching element should be originally turned on, the inspection current whose magnitude is smaller than the inspection current having the normal magnitude flows. In this manner, since the sequence of the inspection current instruction value is inputted to the current DAC, the failure of the current DA converter can be easily detected from the inspection current value sequence of the inspection current value obtained in or by the inspection current detection unit. Moreover, it is possible to readily detect which bit of the switching element (which switching element of the bit) of the output stage of the current DA converter fails.

Here, as "the sequence of the inspection current instruction value changing by 1 LSB in order" used as the inspection instruction value sequence, for instance, it is a sequence of the inspection current instruction value including all range that the inspection current instruction value can take, e.g. from 0 to an upper limit value ((000000000000)~ (111111111111)), from 0 to a lower limit value ((000000000000), (111111111111), (111111111110), ~(100000000000): in a case of two's complement expression). In addition, it is also a sequence of the inspection current instruction value changing by 1 LSB in order (e.g. a sequence including (000000000011), (000000000100)) including an inspection current instruction value (e.g. (000000000011)) in which a value of a bit (e.g. a 3rd bit) that is desired to be failure-detected is "0" and an inspection current instruction value (e.g. (000000000100)) in which a value of a bit (e.g. a 3rd bit) that is desired to be failure-detected is "1". Also, as "the sequence of the inspection current instruction value changing by 1 LSB in order", an inspection instruction value sequence, like (000000000000), (000000000001), (000000000010), . . . , (111111111111), which makes the inspection current instruction value change (increase or decrease) by 1 LSB at each clock cycle is used, or an inspection instruction value sequence, like (000000000000), (000000000000), (000000000000), (000000000001), (000000000001), (000000000001), (000000000010), . . . , which makes the inspection current instruction value change (increase or decrease) by 1 LSB every multiple clock cycles (in the above case, every 3 clocks) could be used. Further, if the current DAC is a bipolar current DAC that can pass both positive and negative currents, for instance, the inspection instruction value sequence could be an inspection instruction value sequence that makes the inspection current instruction value change from 0 to an upper limit value and from 0 to a lower limit value with a 12-bit signed integer inputted and the most significant bit (MSB) being a sign bit.

The above sensor system could further comprise: an AD converter configured to sequentially convert a sensor voltage produced between sensor output terminals of the sensor element into a sensor voltage value, and the control unit could have a PID operating unit configured to generate the control current instruction value by a PTD operation using the sensor voltage value, and the instruction value sequence generating unit could have an input unit configured to input a predetermined input constant value, instead of the sensor voltage value, to the PID operating unit of the control unit; and an inspection-time coefficient setting unit configured to set a coefficient Pc of a P-term and a coefficient Dc of a D-term of the PID operation in the PID operating unit to 0 and also set a coefficient Ic of an I-term of the PID operation to such magnitude that the inspection current instruction value changing by 1 LSB in order is outputted from the PID operating unit.

As for the method of detecting failure of the sensor system, the sensor system could have an AD converter configured to sequentially convert a sensor voltage produced between sensor output terminals of the sensor element into a sensor voltage value, and the control unit could have a PID operating unit configured to generate the control current instruction value by a PID operation using the sensor voltage value, and the method could further comprise: setting a coefficient Pc of a P-term and a coefficient Dc of a D-term of the PID operation to 0, and also setting a coefficient Ic of an I-term of the PID operation to such magnitude that the inspection current instruction value changing by 1 LSB in order is outputted from the PID operating unit; and inputting a predetermined input constant value, instead of the sensor voltage value, to the PID operating unit of the control unit, and generating the inspection instruction value sequence in the PID operating unit.

In this sensor system, the control current instruction value is generated by performing the PID operation using the sensor voltage value in or by the PID operating unit of the control unit. In addition to this, the predetermined input constant value is inputted to the PID operating unit, and the coefficient Pc and the coefficient Dc are set to 0 (Pc=Dc=0) and also the coefficient Ic is set to such magnitude that the inspection current instruction value changing by 1 LSB in order is outputted from the PID operating unit. Therefore, changing each of the coefficients Pc etc. and inputting the input constant value instead of the sensor voltage value eliminate the need for generating the inspection current instruction value separately from the operation in the PID operating unit, and the inspection instruction value sequence of the inspection current instruction value changing by 1 LSB in order can be readily obtained.

As the input unit inputting the input constant value instead of the sensor voltage value to the PID operating unit, a manner in which a signal of the sensor voltage value from the AD converter is cut off so that the sensor voltage value is not inputted to the PID operating unit is raised. Further, a manner in which the sensor voltage value inputted to the AD converter is forcibly set to 0V and the sensor voltage value of "0" is outputted as the sensor voltage value is raised.

Here, the above method of detecting failure of the sensor system could be a method of detecting failure of the sensor system having the sensor element to which the control current is inputted.

According to this method of detecting failure of the sensor system, the sensor system has the sensor element. Then, in the sensor system that can perform a concluded or complete sensing by the sensor element provided in the sensor system, the failure can also be detected.

EMBODIMENTS FOR CARRYING OUT THE INVENTION

Embodiment

Figure 1:
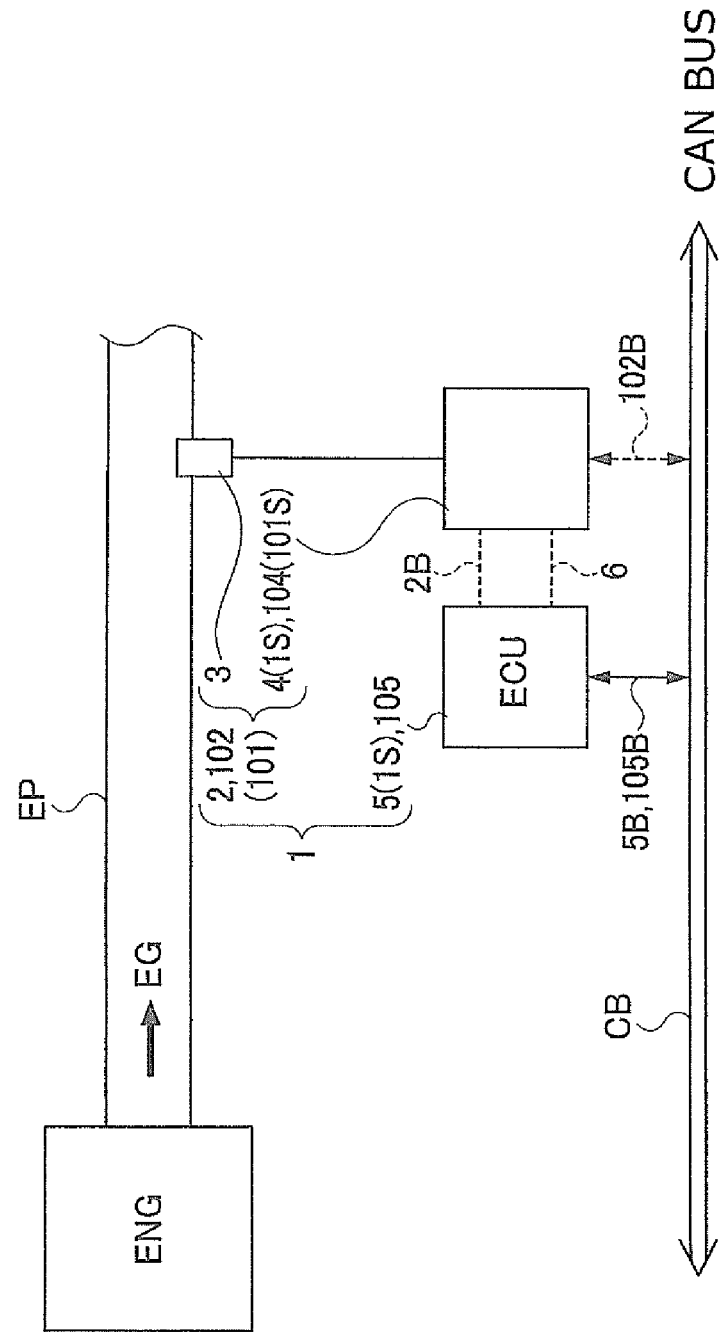
FIG. 1 is an explanatory drawing showing a general configuration when gas sensor systems according to an embodiment and modified embodiments 1 to 3 are used for control of an internal combustion engine of a vehicle.
Figure 2:
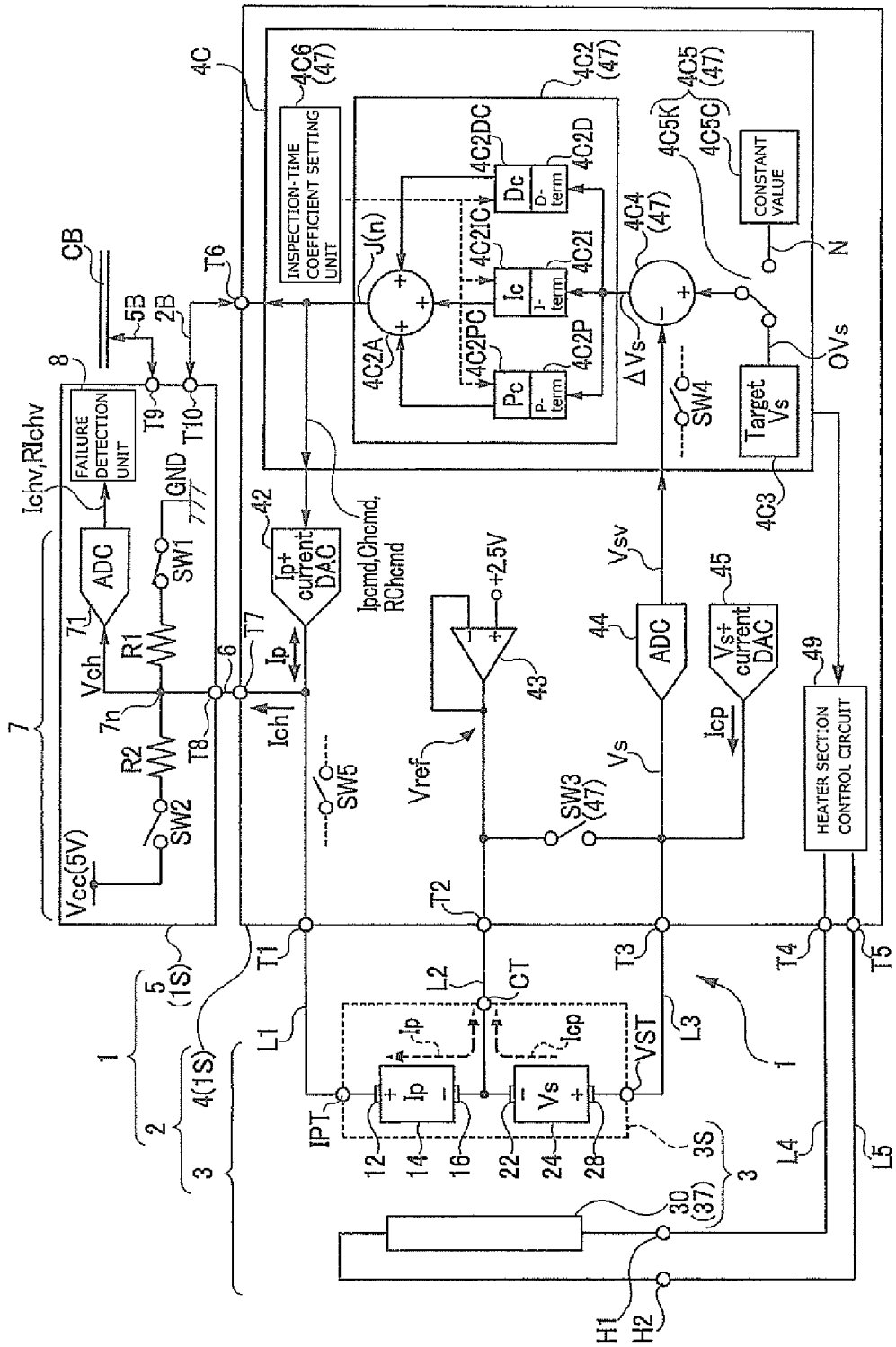
FIG. 2 is an explanatory drawing showing a schematic configuration of the gas sensor systems according to the embodiment and the modified embodiments 1 and 2.

Embodiments of the present invention will be described below with reference to the drawings. FIG. 1 is a drawing showing a general configuration when a gas sensor system 1 according to the present embodiment is used for control of an internal combustion engine of a vehicle. FIG. 2 is a drawing showing a schematic configuration of the gas sensor system 1. This gas sensor system 1 has a gas sensor 2 installed in an exhaust pipe EP of an engine ENG of the vehicle (not shown) and an ECU 5 connected to this gas sensor 2 through a communication line 2B and a connecting wiring 6, each shown by a broken line in FIG. 1, and performing electronic control of the vehicle.

Figure 3:
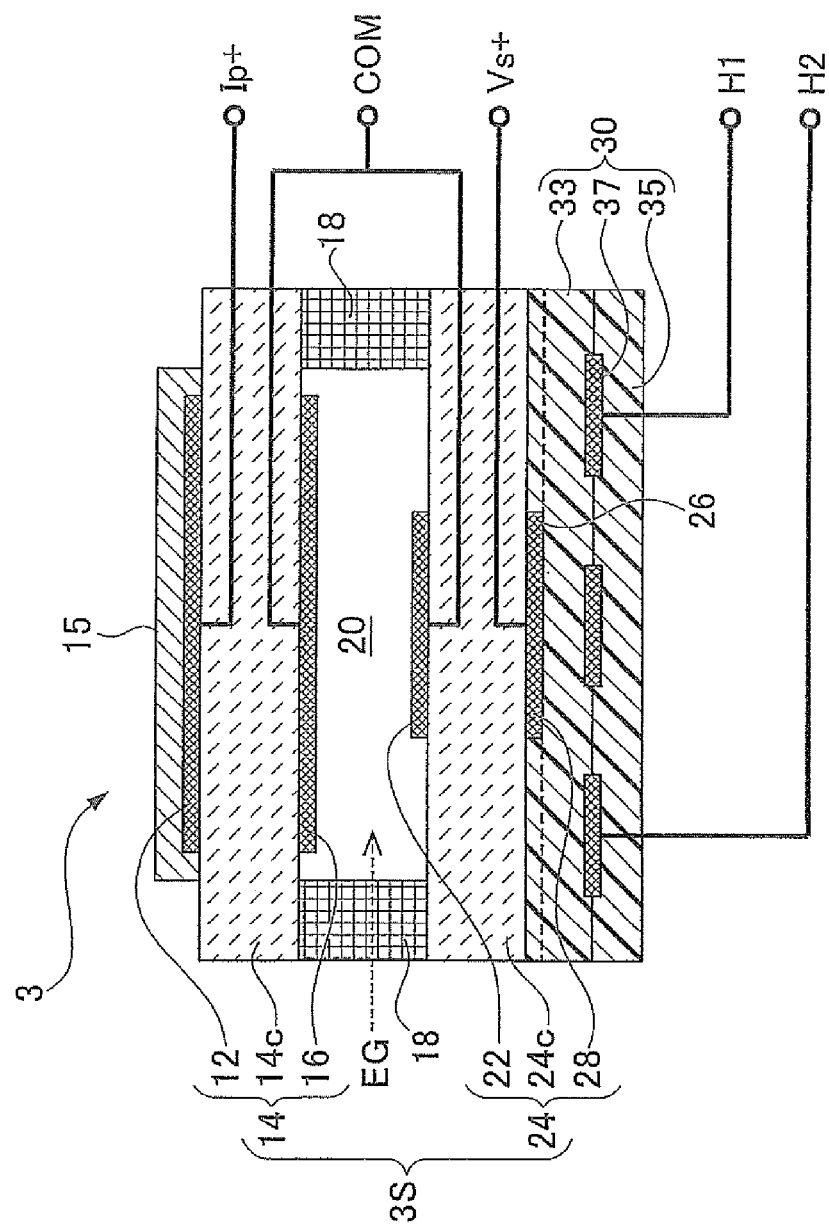
FIG. 3 is an explanatory drawing showing a schematic configuration of a sensor element part in a gas detection unit of the gas sensor systems according to the embodiment and the modified embodiments 1 to 3.

Among these, the gas sensor 2 is an air-fuel ratio sensor (a wide range air-fuel ratio sensor or an all range air-fuel ratio sensor) used for air-fuel ratio feedback control for the internal combustion engine by linearly detecting an oxygen concentration (an air-fuel ratio) as a concentration of a specific gas in exhaust gas EG (gas to be measured). As shown in FIGS. 2 and 3, this gas sensor 2 is formed by a gas detection section (or a gas detection unit) 3 installed in the exhaust pipe EP and detecting the oxygen concentration and a sensor control circuit section (or a sensor control circuit unit) 4 provided with a circuit(s) that controls the gas detection unit 3. The gas sensor 2 (the sensor control circuit unit 4) can transmit and receive data such as the oxygen concentration (the air-fuel ratio) to and from the ECU 5 through the communication line 2B. The sensor control circuit unit 4 is configured by an ASIC (Application Specific IC). The sensor control circuit unit 4 has a control section (or a control unit) 4C that controls a sensor element part 3S provided in the gas detection unit 3 and detects the oxygen concentration (the air-fuel ratio) etc., a current DA converter 42, a reference potential generating circuit 43, an AD converter 44, a micro-current supply circuit 45, a heater section control circuit 49 that controls a heater section provided in the gas detection unit 3 and so on. The ECU 5 is connected to a CAN bus CB of the vehicle through a connecting bus 5B.

It is noted that, as described above, the gas sensor system 1 of the present embodiment is grasped as a sensor system configured by the gas sensor 2 formed by the gas detection unit 3 and the sensor control circuit unit 4 and the ECU 5 connected to this gas sensor 2 (these units 3 and 4). However, if the gas detection unit 3 detecting the oxygen concentration is regarded as an independent member, it can also be understood that the gas sensor system 1 of the present embodiment is configured by this gas detection unit 3 and a detection unit external control system 1S (the sensor control circuit unit 4 and the ECU 5) that is connected to the gas detection unit 3 and controls the gas detection unit 3. That is, the present embodiment can be understood as a description of the gas sensor system 1 including the gas detection unit 3 and also as a description of the gas detection unit 3 and the detection unit external control system 1S that is a different member from this gas detection unit 3.

First, the gas detection unit 3 of the gas sensor 2 will be described. FIG. 3 is an explanatory drawing showing a schematic configuration of the gas detection unit 3. The gas detection unit 3 has the sensor element part 3S formed from a stacked body structured by stacking an oxygen pump cell 14, a porous layer 18 and an oxygen concentration detection cell 24 in this order. Further, the heater section 30 is stacked on one side (on a lower side) of the sensor element part 3S of the gas detection unit 3.

The oxygen pump cell 14 has, as a base body, an electrolyte layer 14c formed from a solid electrolyte body having oxygen ion conductivity, and a pair of electrodes 12 and 16 are formed on both surfaces of the electrolyte layer 14c. Likewise, the oxygen concentration detection cell 24 has, as a base body, an electrolyte layer 24c formed from a solid electrolyte body having oxygen ion conductivity, and a pair of electrodes 22 and 28 (porous electrodes) are formed on both surfaces of the electrolyte layer 24c.

The porous layer 18 is sandwiched between the electrolyte layer 14c and the electrolyte layer 24c. A hollow measurement chamber 20 which is enclosed with these porous layer 18, electrolyte layer 14c and electrolyte layer 24c and into which the exhaust gas EG can be introduced through the porous layer 18 is formed in an expanding direction of the porous layer 18 inside the porous layer 18 (in a right-and-left direction inside the porous layer 18 in FIG. 3) Here, the porous layer 18 makes the exhaust gas EG flow into the measurement chamber 20, and limits its flow speed (its inflow speed).

The second pump electrode 16 of the oxygen pump cell 14 and the second detection electrode 22 of the oxygen concentration detection cell 24 are exposed in the measurement chamber 20. These electrodes 16 and 22 are electrically connected to each other, and are connected to a COM terminal CT of the sensor element part 3S. Further, the first pump electrode 12 of the oxygen pump cell 14 is connected to an Ip+ terminal IPT, and the first detection electrode 28 of the oxygen concentration detection cell 24 is connected to a Vs+ terminal VST.

The whole of the first pump electrode 12 of the oxygen pump cell 14 is covered with a protection layer that suppresses poisoning of the first pump electrode 12. The protection layer 15 is formed by porous ceramic etc., and the exhaust gas EG can reach the first pump electrode 12 through the protection layer 15.

The heater section 30 is stacked on the electrolyte layer 24c of the oxygen concentration detection cell 24. The heater section 30 has a structure in which a heater resistance 37 formed of a conductor is sandwiched between a pair of alumina sheets 33 and 35. The heater resistance 37 is connected to heater terminals H1 and H2. By energizing this heater section 30, temperature of the sensor element part 3S is increased, then the electrolyte layers 14c and 24c of the sensor element part 3S are activated. With this, oxygen ion can move in the electrolyte layers 14c and 24c. Conversely, until the temperature of the sensor element part 3S becomes sufficiently high, e.g. at a start (a cold start) of the vehicle, the electrolyte layers 14c and 24c are not activated, then the oxygen ion cannot move in the electrolyte layers 14c and 24c (which is a high resistance state in which a pump current Ip does not flow).

The alumina sheet 33 of the heater section 30 covers the whole of the first detection electrode 28 of the oxygen concentration detection cell 24, and seals the first detection electrode 28. Therefore, spaces (holes) of an inside of the first detection electrode 28 (the porous electrode) form a reference oxygen chamber 26, and this reference oxygen chamber 26 functions as an inside oxygen reference source.

Next, the sensor control circuit unit 4 of the gas sensor 2 will be described with reference to FIG. 2. The sensor control circuit unit 4 has a first terminal T1 to a fifth terminal T5. These terminals T1 etc. are connected to the terminals Ip+ etc. of the sensor element part 3S of the gas detection unit 3 and the heater terminals H1 and H2 of the heater section 30 of the gas detection unit 3 through a first wiring L1 to a fifth wiring L5 respectively.

Further, the sensor control circuit unit 4 has, in addition to the control unit 4C, the current DA converter 42 connected to the first terminal T1, the reference potential generating circuit 43 connected to the second terminal T2, the AD converter 44 and the micro-current supply circuit 45 both connected to the third terminal T3. The current DA converter 42 passes the pump current Ip, whose magnitude is set according to a control current instruction value (or a control current command value) Ipcmd inputted from an after-mentioned PID operating unit 4C2 of the control unit 4C, through the oxygen pump cell 14 of the sensor element part 3S via the first terminal T1. The reference potential generating circuit 43 generates a reference potential Vref (in the present example, 2.5V) by a buffer circuit using an operational amplifier, and applies the reference potential Vref to the second pump electrode 16 and the second detection electrode 22 via the second terminal T2 and the COM terminal CT of the sensor element part 3S. The AD converter 44 detects, via the Vs+ terminal VST and the third terminal T3, a detection cell voltage (a sensor voltage) Vs produced between the second detection electrode 22 and the first detection electrode 28 of the oxygen concentration detection cell 24, and A/D-converts this voltage, then inputs this A/D-converted voltage as a detection cell voltage value Vsv to the control unit 4C. Here, an output of the micro-current supply circuit 45, which is formed from a DA converter (a current DAC) and passes a constant micro-current Icp (in the present example, Icp=20 μA) and a current for detecting an internal resistance through the oxygen concentration detection cell 24, is also connected to the third terminal T3. The micro-current Icp flowing to the oxygen concentration detection cell 24 serves to pump the oxygen in the measurement chamber into the first detection electrode 28 (the porous electrode), with respect to the oxygen concentration detection cell 24. With this, the reference oxygen chamber 26 functions as the inside oxygen reference source.

The control unit 4C controls the magnitude of the pump current Ip flowing to the oxygen pump cell 14 so that the detection cell voltage Vs (a difference between a potential V3 of the third terminal T3 and a potential V2 of the second terminal T2, which is detected by the AD converter 44) produced between both ends of the oxygen concentration detection cell 24 becomes a predetermined voltage while passing such constant micro-current Icp through the oxygen concentration detection cell 24. With this, pump-in and pump-out of the oxygen ion by the oxygen pump cell 14 are performed so that the oxygen concentration in the exhaust gas EG introduced into the measurement chamber 20 through the porous layer 18 becomes a predetermined concentration.

When carrying out this control, the control unit 4C performs PID control by a digital system. A current value and a current direction of the pump current Ip flowing to the oxygen pump cell 14 which is controlled by this PID control change according to the oxygen concentration (the air-fuel ratio) in the exhaust gas EG introduced into the measurement chamber 20 through the porous layer 18. Therefore, the oxygen concentration in the exhaust gas EG can be detected from the magnitude of the pump current Ip. Further, the sensor control circuit unit 4 performs drive control of the gas sensor 2 (the sensor element part 3S) by feedback-controlling the pump current Ip flowing to the oxygen pump cell 14 by the PID control so that the detection cell voltage Vs produced at the oxygen concentration detection cell 24 becomes the predetermined voltage.

Further, the sensor control circuit unit 4 has the fourth terminal T4 and the fifth terminal T5 that are connected to the heater section control circuit 49. These fourth terminal T4 and fifth terminal T5 are connected to the heater terminals H1 and H2 of the heater section 30 of the sensor element part 3S through the fourth wiring L4 and the fifth wiring L5 respectively. The heater section control circuit 49 is connected to the control unit 4C, and ON/OFF of energization to the heater section is PWM-controlled by a command of the control unit 4C. A detailed description of the PWM control of the heater section 30 by the control unit 4C is omitted here.

Furthermore, a third switch SW3 is connected between the second terminal T2 and the third terminal T3 in the sensor control circuit unit 4. This third switch SW3 is normally OFF (open). However, at time of after-mentioned failure inspection of the current DA converter 42, the third switch SW3 is ON, and these second and third terminals T2 and T3 are short-circuited, then the detection cell voltage Vs inputted to the AD converter 44 is forcibly set to zero.

Details of the feedback control by the PID control in the sensor control circuit unit 4 will be described below. As shown in FIG. 2, the detection cell voltage Vs of the oxygen concentration detection cell 24 is inputted to the sensor control circuit unit 4 through the second terminal T2 and the third terminal T3, and this inputted voltage is sequentially converted into the digital detection cell voltage value Vsv in or by the AD converter 44. A difference unit 4C4 calculates a difference (ΔVs=OVs−Vsv: a deviation from a target) between a target Vs value OVs held in or by a target Vs value input unit 4C3 and the detection cell voltage value Vsv inputted to the control unit 4C. Then, a difference value ΔVs ( . . . , ΔVs(n−1), ΔVs(n), ΔVs(n+1), . . . , here, "n" is a natural number) that is the difference between the target Vs value OVs and the detection cell voltage value Vsv is sequentially inputted to the PID operating unit 4C2 at each clock cycle.

The PID operating unit 4C2 has a proportional operating unit 4C2P for calculating a P-term, an integral operating unit 4C2I for calculating an I-term, a differential operating unit 4C2D for calculating a D-term and an addition operating unit 4C2A for obtaining the sum of these calculation values. These operating units 4C2P etc. have coefficient holding units 4C2PC, 4C2IC and 4C2DC that hold a proportional coefficient Pc, an integral coefficient Ic and a differential coefficient Dc each used for the operation, respectively. The proportional operating unit 4C2P calculates a value obtained by multiplying the difference value ΔVs by the proportional coefficient Pc. The integral operating unit 4C2I calculates the sum of a value obtained by multiplying the difference value ΔVs by the integral coefficient Ic and a value of a PID operation obtained last time. The differential operating unit 4C2D calculates a value obtained by multiplying a difference obtained by subtracting a difference value ΔVs(n−1) obtained last time from a current difference value ΔVs(n) by the differential coefficient Dc. A PID operation value J(n) is the sum of these P-term, I-term and D-term, and is represented by the following expression (1) using the difference value ΔVs(n) etc.

$$J(n)=Pc\cdot\Delta Vs(n)+Ic\cdot\Delta Vs(n)+J(n-1)+Dc(\Delta Vs(n)-\Delta Vs(n-1)) \quad (1)$$

The control unit 4C inputs the PID operation value J(n) of a 14-bit signed integer obtained in this way to the current DA converter 42 as the control current instruction value Ipcmd. The current DA converter 42 outputs the positive or negative analog pump current (a control current) Ip whose magnitude corresponds to the control current instruction value Ipcmd toward the oxygen pump cell 14. In this manner, the sensor element part 3S is feedback-controlled by the PID control by the control unit 4C of the sensor control circuit unit 4.

Here, this control current instruction value Ipcmd indicates the magnitude of the pump current (the control current) Ip outputted from the current DA converter 42, i.e. the oxygen concentration (the air-fuel ratio) of the exhaust gas EG. Therefore, the control current instruction value Ipcmd is separately transmitted to the ECU 5 through a sixth terminal T6, the communication line 2B and a tenth terminal T10.

Figure 5:
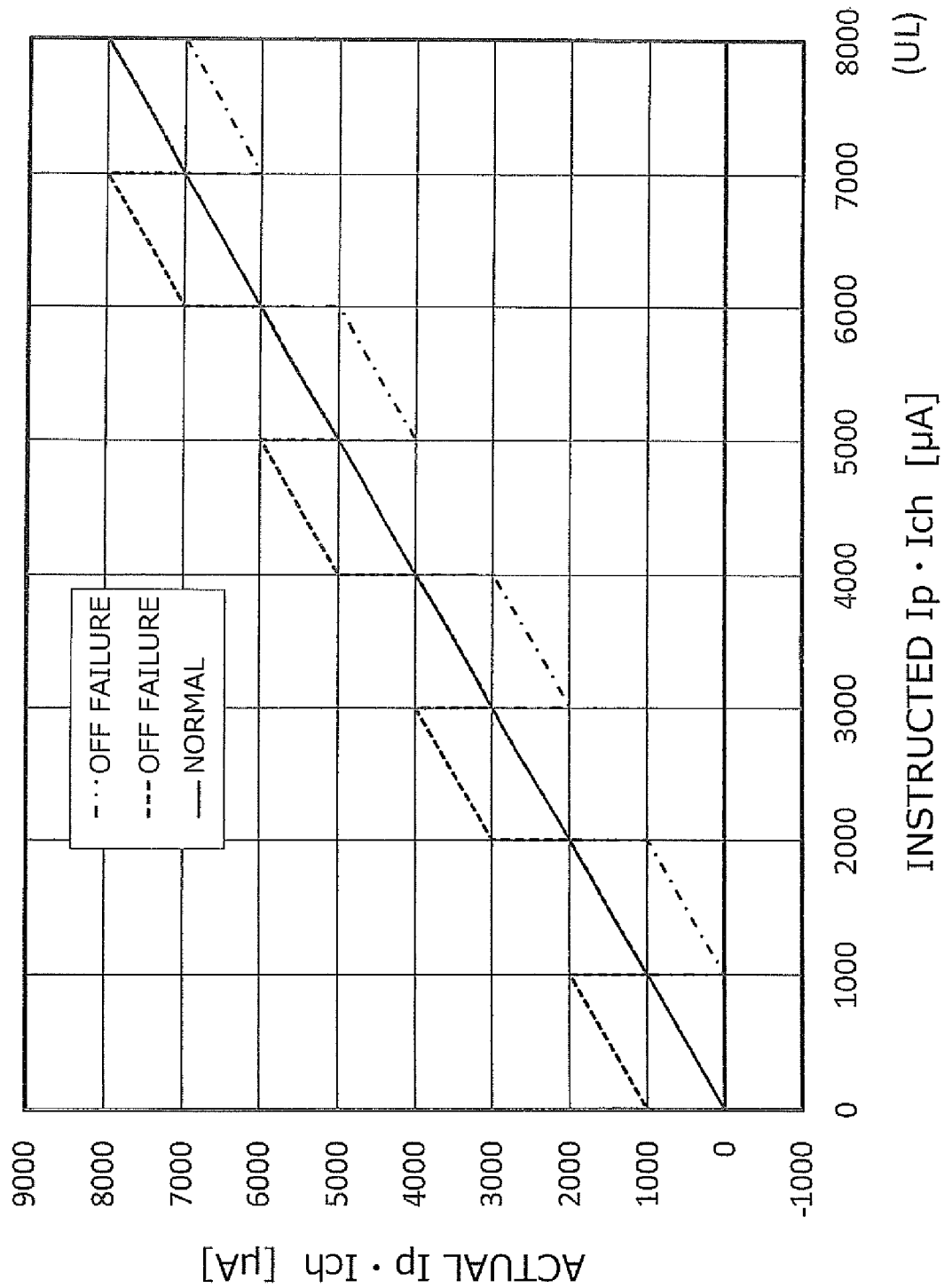
FIG. 5 is a graph showing a relationship between an instructed pump current Ip and a pump current Ip actually obtained and between an instructed inspection current Ich and an inspection current Ich actually obtained when the current DA converter is normal and when an 11th bit of an output stage is failed (an on-failure or an off-failure of the 11th bit occurs).

Next, behavior of the pump current Ip when the current DA converter 42 fails will be described. The current DA converter 42 outputs the positive or negative analog pump current Ip according to a binary code of an inputted predetermined bit depth (the number of predetermined bits, in the present embodiment, 13 bits), more specifically, the control current instruction value Ipcmd expressed as the 14-bit signed integer. There may occur a case where this current DA converter 42 fails. As its failure modes, there are "on-failure" in which any of switching elements corresponding to the respective bits of an output stage is normally turned on or "off-failure" in which any of the switching elements corresponding to the respective bits of the output stage is normally turned off. When these failures occur, the magnitude of the pump current Ip may be abnormal by magnitude corresponding to a bit (a digit) that corresponds to the failed switching element. FIG. 5 is a graph showing a relationship between an instructed pump current Ip and a pump current Ip actually obtained. A solid line indicates a case where the current DA converter is normal. A broken line indicates a case where the on-failure occurs at a switching element of an 11th bit. A dashed line indicates a case where the off-failure occurs at the switching element of the same 11th bit. Here, in the current DA converter 42, the most significant bit (MSB: a 14th bit) is a sign bit, and a bit depth is 13 bits. FIG. 5 illustrates a case where the sign bit is a positive value, and a range of integers (0 to 8191) expressed in bit depth of 13 bits corresponds to a range of 0 to 8000 μA.

As can be understood from the graph shown in this FIG. 5, in both cases of the on-failure indicated by the broken line and the off-failure indicated by the dashed line, depending on the magnitude of the pump current Ip (the control current instruction value Ipcmd), a case where an actual pump current Ip becomes the same value as a normal pump current Ip and a case where the actual pump current Ip greatly deviates from the normal pump current Ip alternately occur. This is because, for instance, in a case where a sign of the 11th bit of the control current instruction value Ipcmd is 1 when the on-failure occurs at the switching element of the 11th bit, the pump current Ip whose magnitude is the same as that of the normal case (the normal pump current Ip) flows. On the other hand, in a case where the sign of the 11th bit of the control current instruction value Ipcmd is 0, the pump current Ip whose magnitude is greater than that of the normal case (the normal pump current Ip) flows.

Therefore, in the present embodiment, in order to detect the failure of the current DA converter 42, instead of the 14-bit control current instruction value Ipcmd, an inspection current instruction value (or an inspection current command value) Chcmd inputted to the current DA converter 42 is set as the following values, then the failure of the current DA converter 42 is detected. That is, the inspection current instruction value Chcmd whose binary code is changed by 1 LSB in order, like (00000000000000), (00000000000001), (00000000000010), . . . , (01111111111111) from zero (00000000000000) to an upper limit value UL (01111111111111) of a range indicating positive current values within a range of the 14-bit inspection current instruction value Chcmd that can be inputted to the current DA converter 42, more specifically, within a range of the 14-bit binary code (00000000000000) to (11111111111111), is inputted to the current DA converter 42. With this, when the current DA converter 42 does not fail, this current DA converter 42 outputs an inspection current Ich that increases linearly in a ramp function shape from 0 to the upper limit value (e.g. 8000 μA). Also in the case where the inspection current instruction value Chcmd is inputted to the current DAC 42 and the inspection current Ich is outputted from the current DAC 42 as described above, a relationship between an instructed inspection current Ich and an actually flowing inspection current Ich becomes a relationship shown in FIG. 5.

Further, subsequently, the inspection current instruction value Chcmd whose binary code is changed by 1 LSB in order from zero (00000000000000) to a lower limit value LL (10000000000000) of a range indicating negative current values is inputted to the current DA converter 42, although this is not shown in the drawing. Here, if the most significant bit (the 14th bit: MSB) of instruction values (signs) of the 14 bits inputted to the current DA converter 42 is "0", it indicates a positive current value, whereas if the most significant bit (the 14th bit: MSB) is "1", it indicates a negative current value, and the negative value is expressed using two's complement. It is noted that although the inspection current instruction value Chcmd is changed (increased or decreased) by 1 LSB in order at each clock cycle, the inspection current instruction value Chcmd could be changed (increased or decreased) by 1 LSE every multiple clock cycles.

The gas sensor system 1 of the present embodiment has an instruction value sequence generating unit 47 that generates an inspection instruction value sequence RChcmd that is a sequence (or a series) of the inspection current instruction value Chcmd using the above-mentioned PID operating unit 4C2. More specifically, this instruction value sequence generating unit 47 includes, in the sensor control circuit unit 4, the third switch SW3 to short-circuit the second terminal T2 and the third terminal T3, a constant input unit 4C5, the PID operating unit 4C2, an inspection-time coefficient setting unit 4C6, etc. in the control unit 4C.

Then, when generating the inspection instruction value sequence RChcmd to perform the inspection of the current DA converter 42, the third switch SW3 is turned on, and the second terminal T2 and the third terminal T3 are short-circuited, then the detection cell voltage Vs inputted to the AD converter 44 is forcibly set to zero. With this, the detection cell voltage value Vsv as an output of the AD converter 44 also becomes zero.

On the other hand, by switching a switching part 4C5K of the constant input unit 4C5, instead of the target Vs value input unit 4C3, a constant section 4C5C is connected to the difference unit 4C4. With this connection, the PID operating unit 4C2 inputs a predetermined input constant value N instead of a sensor voltage value Vsv.

In addition, the proportional coefficient Pc, the integral coefficient Ic and the differential coefficient Dc held in the respective coefficient holding units 4C2PC, 4C2IC and 4C2DC in the PID operating unit 4C2 are changed by the inspection-time coefficient setting unit 4C6. More specifically, Pc is changed to zero (Pc=0), and Dc is changed to zero (Dc=0). As can be easily understood from the above-mentioned expression (1), by setting the proportional coefficient Pc and the differential coefficient Dc to 0 (Pc=0, Dc=0), outputs of the P-term and the D-term by the proportional operating unit 4C2P and the differential operating unit 4C2D are both 0. Further, the integral coefficient Ic is changed to 1 (Ic=1). By setting the integral coefficient Ic to 1 (Ic=1), the inspection current instruction value Chcmd changing by 1 LSB in order at each clock cycle is outputted from the PID operating unit 4C2. In this manner, instead of the control current instruction value Ipcmd, the inspection instruction value sequence RChcmd, in which the predetermined inspection current instruction values Chcmd inputted to the current DA converter 42 are arranged in order and by which the failure of the current DA converter 42 can be detected, can be generated from the PID operating unit 4C2 of the control unit 4C. As described above, with this, when the current DA converter 42 does not fail, this current DA converter 42 outputs the inspection current Ich increasing linearly in the ramp function shape from 0 to the upper limit value (e.g. 8000 μA).

Further, besides changing Pc and Dc to 0 (Pc=0, Dc=0), by changing Ic to −1 (Ic=−1), the inspection instruction value sequence RChcmd, in which the inspection current instruction values Chcmd are arranged in order and by which the failure of the current DA converter 42 can be detected, is generated. With this, when the current DA converter 42 does not fail, this current DA converter 42 outputs an inspection current Ich that decreases linearly in the ramp function shape from 0 to the lower limit value (e.g. 8000 μA). Here, in the present embodiment, as an example, the value of Ic is changed from "Ic=1" to "Ic=−1" in terms of the sign. However, a sign of the target Vs value OVs held in the target Vs value input unit 4C3 could be changed.

As described above in the present embodiment, changing each of the coefficients Pc etc. and inputting the input constant value N instead of the detection cell voltage value Vsv eliminate the need for generating the inspection current instruction value Chcmd separately from the operation in the PID operating unit 4C2, and the inspection instruction value sequence RChcmd of the inspection current instruction value Chcmd changing by 1 LSB in order can be readily obtained.

Next, detection of the inspection current Ich will be described with reference to FIG. 2. In the present embodiment, the failure detection of the current DA converter 42 is performed in a high impedance state in which temperature of the sensor element part 33 (the oxygen pump cell 14) is low then the sensor element part 3S (the oxygen pump cell 14) is not activated yet, i.e. in a state in which the inspection current Ich does not flow toward the oxygen pump cell 14 (in a state in which magnitude of the inspection current Ich flowing toward the oxygen pump cell 14 is negligible). Further, an inspection circuit 7 for detecting the magnitude of the inspection current Ich is provided not in the sensor control circuit unit 4 but in the ECU 5. That is, the current DA converter 42 and the inspection circuit 7 provided in the ECU 5 are connected through a seventh terminal T7 of the sensor control circuit unit 4 of the gas sensor 2, the connecting wiring 6 and an eighth terminal T8 of the ECU 5.

The inspection circuit 7 includes a circuit connected to a ground potential GND through a resistance R1 and a first switch SW1 and a circuit connected to a power supply potential Vcc through a resistance R2 and a second switch SW2. Then, when the current DA converter 42 outputs the positive inspection current Ich, the second switch SW2 is turned off, while the first switch SW1 is turned on. With this, the positive inspection current Ich from the current DA converter 42 flows to the ground potential GND through the resistance R1 and the first switch SW1. On the other hand, when the current DA converter 42 outputs the negative inspection current Ich, i.e. when the inspection current Ich is drawn into the current DA converter 42, the first switch SW1 is turned off, while the second switch SW2 is turned on. With this, the negative inspection current Ich flows from the power supply potential Vcc to the current DA converter 42 through the resistance R2 and the second switch SW2.

Therefore, when the inspection current Ich is the positive current, magnitude of an inspection voltage Vch at an inspection node 7n is R1·TIch (Vch=R1·Ich). When the inspection current Ich is the negative current, it is Vcc−R2·Ich (Vch=Vcc−R2·Ich). Thus, the magnitude of this inspection voltage Vch is detected through an AD converter 71 connected to the inspection node 7n, then an inspection current value Ichv is obtained.

Further, a failure detection unit 8 detects the failure of the current DA converter 42 from an inspection current value sequence RIchv in which the inspection current values Ichv are arranged in order of detection. More specifically, if the inspection current value sequence RIchv, i.e. the inspection current Ich actually outputted from the current DA converter 42, changes linearly in the ramp function shape as shown by the solid line in FIG. 5, it can be said that there is no bit failure at the current DA converter 42.

On the other hand, if the inspection current value sequence RIchv has parts that greatly change stepwise as shown by the broken line or the dashed line in FIG. 5, it can be said that the bit failure occurs at the current DAC 42. Further, from its changing position, it is determined which bit (which digit) to which the switching element corresponds fails (bit-fails) (it is determined which switching element, corresponding to a bit (a digit) of the changing position, fails).

In this manner, it is possible to detect the failure of the current DA converter 42 such as the presence or absence of the bit failure of the current DAC 42 and determination or localization of the failed bit. A proper operation using the gas sensor system 1 having no failure can therefore be possible. Further, since the inspection instruction value sequence RChcmd is inputted to the current DAC 42, the failure of the current DA converter 42 can be easily detected from the inspection current value sequence RIchv of the inspection current value Ichv obtained in or by the AD converter 71. Moreover, it is possible to readily detect which bit of the switching element (which switching element of the bit) of the output stage of the current DAC 42 fails.

In this gas sensor system 1, during a period in which the impedance of the sensor element part 3S (the oxygen pump cell 14) is high as mentioned above, more specifically, before the sensor element part 3S is heated or adequately heated by the heater section 30 after starting the engine ENG, the presence or absence of the failure of the current DA converter 42 is diagnosed. Then, if the current DA converter 42 is normal (no failure), the detection of the oxygen concentration (the air-fuel ratio) in the exhaust gas EG is carried out by the gas sensor system 1 in the normal way. It is noted that after a lapse of a predetermined time from a stop of the engine ENG, the presence or absence of the failure of the current DA converter 42 could be diagnosed.

Figure 4:
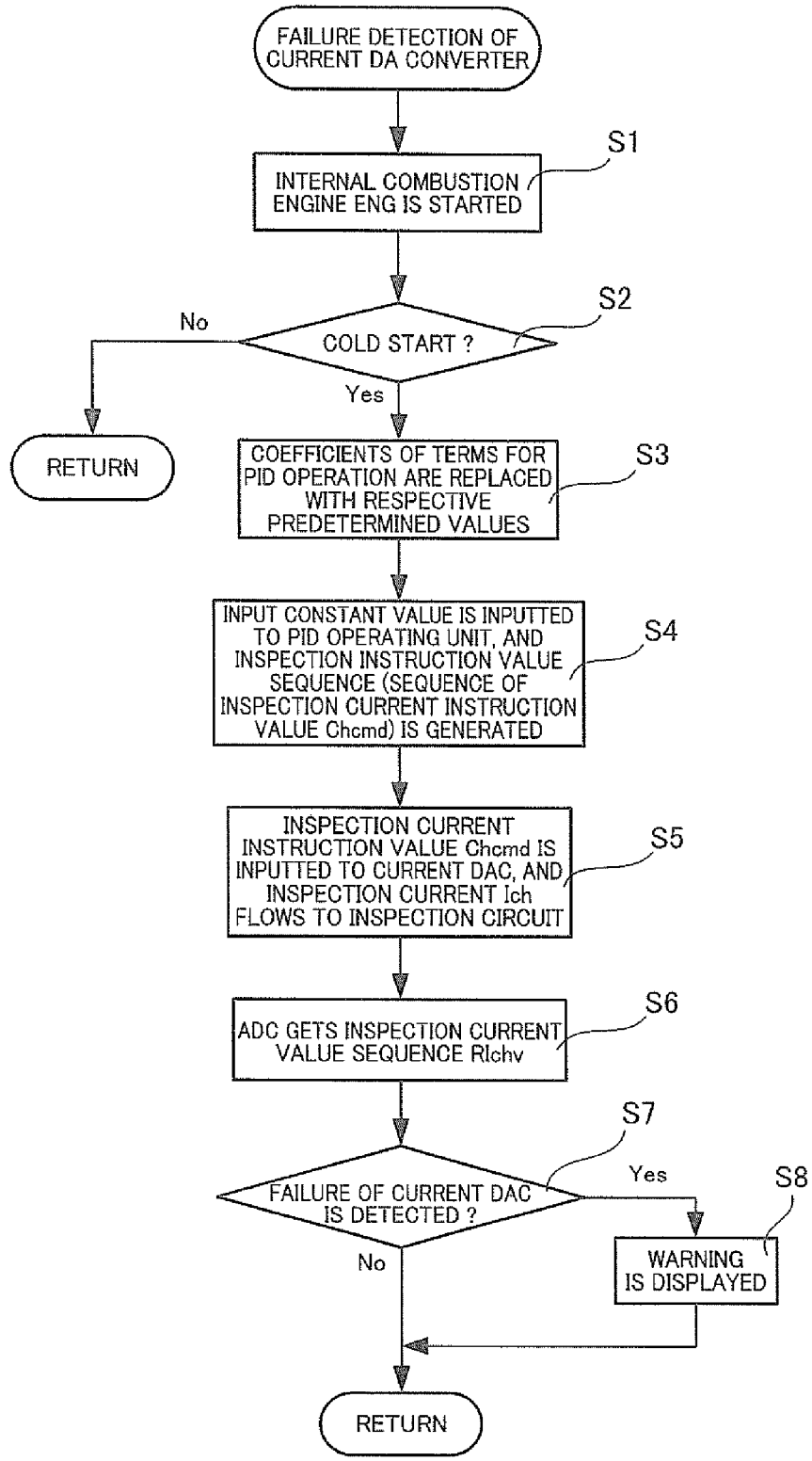
FIG. 4 is a flow chart showing a flow of a process of failure detection of a current DA converter, according to the embodiment and the modified embodiments 1 to 3.

FIG. 4 is a flow chart showing a flow of a process of the failure detection of the current DA converter 42 in the gas sensor system 1. As shown in FIG. 4, in this gas sensor system 1, when the engine ENG is started (step S1), the routine proceeds to step S2, and a judgment is made as to whether or not this start is the so-called cold start. In general, there are generally two patterns in an engine ENG starting state. One is a case (a case of the so-called cold start) where a sufficient time elapses from the last stop of drive of the engine and the engine is started in a state in which the engine ENG (therefore, also the sensor element part 3S of the gas sensor 2) is sufficiently cooled. The other is a case, such as very-short-time parking, where a sufficient time does not elapse from the last stop of the engine and the engine is started in a state in which the engine ENG (therefore, also the sensor element part 3S of the gas sensor 2) is not sufficiently cooled.

In the present embodiment, as described above, in the state of the high impedance of the sensor element part 3S (the oxygen pump cell 14) in which the inspection current Ich does not flow into the oxygen pump cell 14 through the first terminal T1, by passing the inspection current Ich through the inspection circuit 7, the failure of the current DA converter 42 is detected. Because of this, at step S2, a judgment is made as to whether or not the sensor element part 3S (the oxygen pump cell 14) is sufficiently cooled and is in the high impedance state. If the sensor element part 3S (the oxygen pump cell 14) is not in the high impedance state (if the engine start is a hot start: No at step S2), the routine is returned to a normal control of the gas sensor 2 without performing the failure detection of the current DAC 42. On the other hand, if the sensor element part 3S (the oxygen pump cell 14) is in the high impedance state (YES at step S2), the routine proceeds to step S3.

As a judging method as to whether the sensor element part 3S (the oxygen pump cell 14) is in the high impedance state, for instance, it is a method of judging whether or not a predetermined time (e.g. 30 minutes) or greater elapses from the last engine ENG stop, or a method of judging the high impedance state by temperature of cooling water of the engine ENG. In addition, it could be a method of estimating the impedance of the oxygen pump cell 14 from magnitude of an impedance of the oxygen concentration detection cell 24 by passing the pilot micro-current Icp from the micro-current supply circuit 45, or a method of estimating the impedance of the sensor element part 3S (the oxygen pump cell 14) from a resistance value of the heater resistance 37 of the gas detection unit 3.

Next, at step S3, the coefficients Pc, Ic and Dc of the P-term, the I-term and the D-term held in the respective coefficient holding units 4C2PC, 4C2IC and 4C2DC in the PID operating unit 4C2 of the control unit 4C are replaced with respective predetermined values (Pc=Dc=0, and Ic=1) by the inspection-time coefficient setting unit 4C6.

Subsequently, at step S4, the input constant value N is inputted to the PID operating unit 4C2, and the PID operating unit 4C2 generates the inspection current instruction value Chcmd changing by 1 LSB in order at each clock cycle, and generates the inspection instruction value sequence RChcmd in which the inspection current instruction values Chcmd are arranged. In this manner, changing each of the coefficients Pc etc. and inputting the input constant value N instead of the detection cell voltage value Vsv eliminate the need for generating the inspection current instruction value Chcmd separately from the operation in the PID operating unit 4C2, and the inspection instruction value sequence RChcmd of the inspection current instruction value Chcmd changing by 1 LSB in order can be readily obtained.

Further, at step S5, the generated inspection current instruction value Chcmd is sequentially inputted to the current DAC 42, and the inspection current Ich outputted from the current DAC 42 flows to the inspection circuit 7.

At step SG, the AD converter 71 gets the inspection current value sequence RIchv in which the inspection current values Ichv are arranged in order of detection. At subsequent step S7, the bit failure of the current DAC 42 is detected using the inspection current value sequence RIchv obtained. Here, if the failure is detected (Yes at step S7), the routine proceeds step S8, and a warning (a serviceman-call etc.) indicating the bit failure of the current DAC 42 is displayed to a driver, then the routine is returned to the normal control of the gas sensor 2.

In this manner, it is possible to detect the failure of the current DA converter 42 such as the presence or absence of the bit failure of the current DAC 42 and determination or localization of the failed bit. A proper operation using the gas sensor system 1 having no failure can therefore be possible. Further, since the inspection instruction value sequence RChcmd is inputted to the current DAC 42, the failure of the current DA converter 42 can be easily detected from the inspection current value sequence RIchv of the inspection current value Ichv obtained in or by the AD converter 71. Moreover, it is possible to readily detect which bit of the switching element (which switching element of the bit) of the output stage of the current DAC 42 fails.

Modified Embodiment 1

In the above embodiment, when performing the inspection of the current DAC 42, in order to input the input constant value N to the PID operating unit 4C2, the input from the target Vs value input unit 4C3 to the difference unit 4C4 is switched to the input of the input constant value N from the constant section 4C5C by the switching part 4C5K. In addition, in order for the detection cell voltage value Vsv as the output of the AD converter 44 to be also set to zero, the third switch SW3 is turned on, and the detection cell voltage Vs inputted to the AD converter 44 is forcibly set to zero. In contrast to this, in the modified embodiment 1, a fourth switch SW4 shown by a broken line in FIG. 2 is provided between the AD converter 44 and the difference unit 4C4. Then, when performing the inspection of the current DAC 42, this fourth switch SW4 is turned off, so that the output (the detection cell voltage value Vsv) from the AD converter 44 is not inputted to the difference unit 4C4. The other configurations are the same as those of the above embodiment.

Also in the gas sensor system 1 of the modified embodiment 1, the PID operating unit 4C2 can obtain the same inspection instruction value sequence RChcmd of the sequence of the inspection current instruction value Chcmd as that of the above embodiment.

Modified Embodiment 2

In the above embodiment and the modified embodiment 1, as a timing at which the failure detection of the current DAC 42 is performed, it is the case where the impedance of the sensor element part 3S (the oxygen pump cell 14) is high, more specifically, the case where the engine ENG is started as the cold start. In contrast to this, in the modified embodiment 2, a fifth switch SW5 shown by a broken line in FIG. 2 is provided between the current DAC 42 and the first terminal T1. Then, when performing the inspection of the current DAC 42, this fifth switch SW5 is turned off, so that the inspection current Ich flows to the inspection circuit 7. The other configurations are the same as those of the above embodiment of the modified embodiment 1.

By employing such configuration, regardless of whether the impedance of the sensor element part 3S (the oxygen pump cell 14) is high, the failure detection of the current DAC 42 can be carried out. More specifically, the failure detection of the current DAC 42 could be carried out when the engine ENG is in an idling state during vehicle stop to wait at traffic lights or park or when performing fuel-cut by which fuel is not supplied in the engine by engine brake etc.

Modified Embodiment 3

Figure 6:
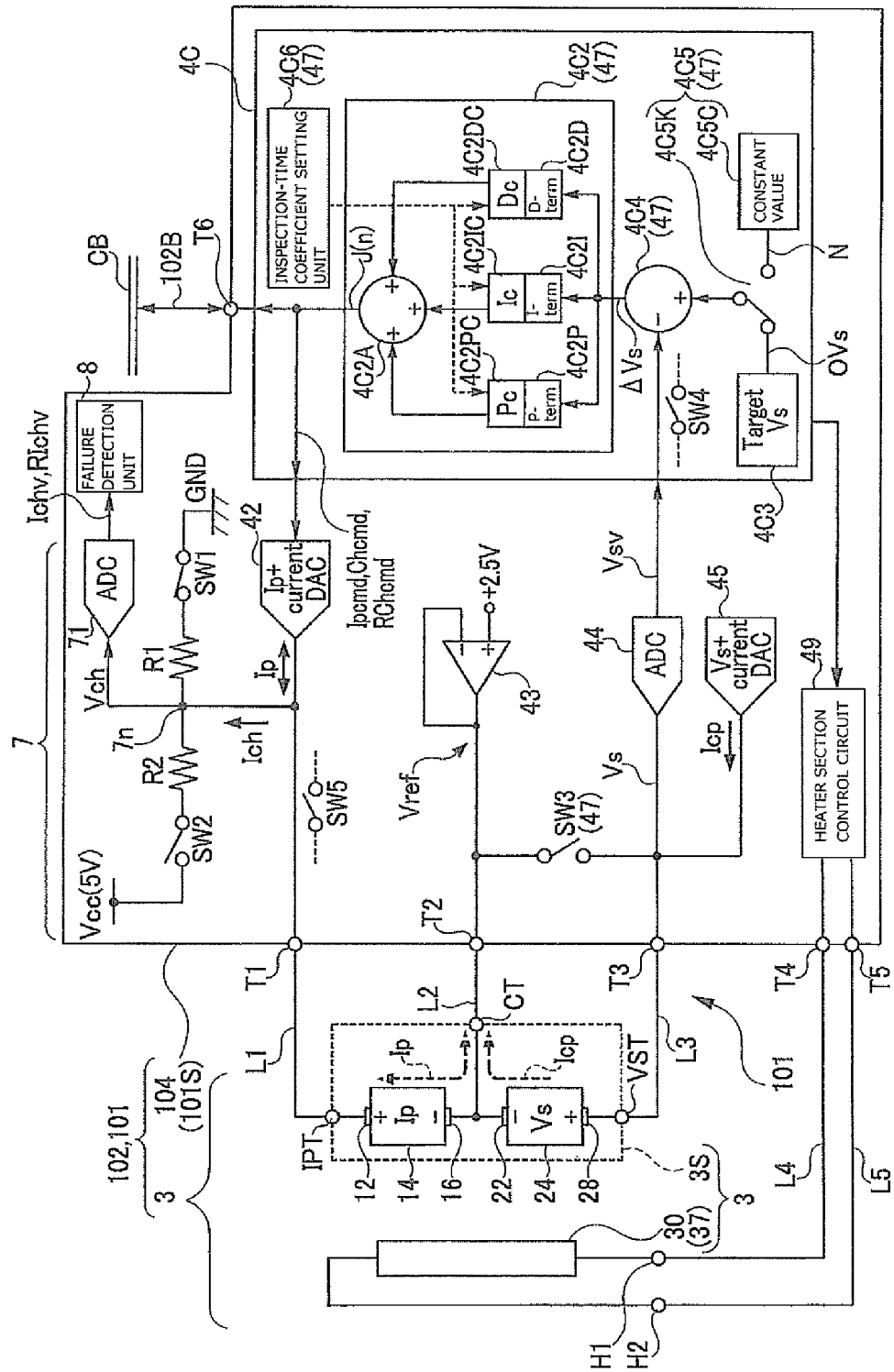
FIG. 6 is an explanatory drawing showing a schematic configuration of the gas sensor system according to the modified embodiment 3.

In the above embodiment and the modified embodiments 1 and 2, the inspection circuit 7 and the failure detection unit 8 are provided in the ECU 5 that is a different unit from the sensor control circuit unit 4 of the gas sensor 2 (see FIG. 2). In contrast to this, in a gas sensor system 101 of the modified embodiment 3, as shown in FIG. 6, as a different point from the above embodiments, the inspection circuit 7 and the failure detection unit 8 are provided in a sensor control circuit unit 104 of a gas sensor 102.

By providing the inspection circuit 7 and the failure detection unit 8 in the sensor control circuit unit 104 in this manner, unlike the above embodiments, there is no need to provide the communication line 2B and the connecting wiring 6, both shown by broken lines in FIG. 1, between the sensor control circuit unit 4 and the ECU 5. That is, the gas sensor 102 (the sensor control circuit unit 104) is connected to the CAN bus CB through a connecting bus 102B, and the ECU 5 is connected to the CAN bus CB through a connecting bus 105B (see FIG. 1).

It is noted that, as described above, the gas sensor system 101 of the modified embodiment 3 is also grasped as the gas sensor 102 formed by the gas detection unit 3 and the sensor control circuit unit 104. However, if the gas detection unit 3 detecting the oxygen concentration is regarded as an independent member, it can also be understood that the gas sensor 102 of the modified embodiment 3 is configured by this gas detection unit 3 and a detection unit external control system 101S (the sensor control circuit unit 104) that is connected to the gas detection unit 3 and controls the gas detection unit 3. That is, the modified embodiment 3 can be understood as a description of the gas sensor system 101 including the gas detection unit 3 and also as a description of the gas detection unit 3 and the detection unit external control system 101S that is a different member from this gas detection unit 3.

Although the present technique has been described in accordance with the above embodiment and the modified embodiments 1 to 3, the present technique is not limited to the above embodiments, but, needless to say, can be properly changed or modified without departing from the scope of the present technique. For instance, in the embodiments, as the gas sensor 2, the air-fuel ratio sensor (the wide range air-fuel ratio sensor or the all range air-fuel ratio sensor) detecting the oxygen concentration (the air-fuel ratio) in the exhaust gas EG is described as an example. However, as the gas sensor, it is not limited to the air-fuel ratio sensor, but could be a NOx sensor for detecting a concentration of nitrogen oxides (NOx) as a concentration of a specific gas. Further, the present technique could be applied to a sensor system having a sensor element that inputs the control current, which is not necessarily the gas sensor, a current DA converter that outputs this control current and a control unit that is inputted (connected) to this current DA converter.

EXPLANATION OF REFERENCE 1, 101 . . . gas sensor system (sensor system)
1S, 101S . . . detection unit external control system (sensor system)
2, 102 . . . gas sensor
3 . . . gas detection unit (sensor)
3S . . . sensor element part (sensor element)
14 . . . oxygen pump cell
24 . . . oxygen concentration detection cell
Vs . . . detection cell voltage (sensor voltage)
Vsv . . . detection cell voltage value (sensor voltage value)
22 . . . second detection electrode
4, 104 . . . sensor control circuit unit (sensor element)
4C . . . control unit
4C2 . . . PID operating unit
J(n), J(n−1) . . . PID operation value
4C2P . . . proportional operating unit
4C2I . . . integral operating unit
4C2D . . . differential operating unit
4C2A . . . addition operating unit
4C2PC, 4C2IC, 4C2DC . . . coefficient holding unit
Pc . . . proportional coefficient
Ic . . . integral coefficient
Dc . . . differential coefficient
4C3 . . . target Vs value input unit
OVs . . . target Vs value 4C4 . . . difference unit
ΔVs, ΔVs(n), ΔVs(n−1) . . . difference value
4C5 . . . constant input unit (input unit)
4C5C . . . constant section
N . . . input constant value
4C5K . . . switching part
SW3 . . . third switch (input unit)
4C6 . . . inspection-time coefficient setting unit
Ipcmd . . . control current instruction value
Chcmd . . . inspection current instruction value
UL . . . upper limit value (of inspection current instruction value)
LL . . . lower limit value (of inspection current instruction value)
RChcmd . . . inspection instruction value sequence
42 . . . current DA converter
44 . . . AD converter
Ip . . . pump current (control current)
Icp . . . micro-current
5, 105 . . . ECU
6 . . . connecting wiring (between sensor control circuit unit and ECU)
7 . . . inspection circuit
7n . . . inspection node
Ich . . . inspection current
Ichv . . . inspection current value
RIchv . . . inspection current value sequence
Vcc . . . power supply potential
GND . . . ground potential
Vch . . . inspection voltage
71 . . . AD converter (inspection current detection unit)
8 . . . failure detection unit

The invention claimed is:

1. A sensor system comprising:
a current DA converter configured to output a control current toward a sensor element;
a control unit configured to generate a control current instruction value corresponding to magnitude of the control current and input the control current instruction value to the current DA converter;
an instruction value sequence generating unit configured to generate, instead of the control current instruction value generated by the control unit, an inspection instruction value sequence in which predetermined inspection current instruction values inputted to the current DA converter are arranged in order and by which failure of the current DA converter can be detected;
an inspection current detection unit configured to detect an inspection current value of an inspection current that is outputted from the current DA converter sequentially inputting the inspection current instruction value forming the inspection instruction value sequence; and
a failure detection unit configured to detect the failure of the current DA converter from an inspection current value sequence in which the inspection current values detected by the inspection current detection unit are arranged in order of detection.

2. The sensor system as claimed in claim 1, wherein the inspection instruction value sequence is a sequence of the inspection current instruction value changing by 1 LSB in order within a range of the inspection current instruction value that can be inputted to the current DA converter.

3. The sensor system as claimed in claim 2, further comprising:
an AD converter configured to sequentially convert a sensor voltage produced between sensor output terminals of the sensor element into a sensor voltage value,
wherein the control unit has:
a PID operating unit configured to generate the control current instruction value by a PID operation using the sensor voltage value, and
wherein the instruction value sequence generating unit has:
an input unit configured to input a predetermined input constant value, instead of the sensor voltage value, to the PID operating unit of the control unit; and
an inspection-time coefficient setting unit configured to set a coefficient Pc of a P-term and a coefficient Dc of a D-term of the PID operation in the PID operating unit to 0 and also set a coefficient Ic of an I-term of the PID operation to such magnitude that the inspection current instruction value changing by 1 LSB in order is outputted from the PID operating unit.

4. The sensor system as claimed in claim 1, further comprising:
the sensor element to which the control current is inputted.

5. A method of detecting failure of a sensor system, the sensor system having a current DA converter configured to output a control current toward a sensor element and a control unit configured to generate a control current instruction value corresponding to magnitude of the control current and input the control current instruction value to the current DA converter, the method comprising:
generating an inspection instruction value sequence in which predetermined inspection current instruction valuesare arranged in order and by which failure of the current DA converter can be detected;
sequentially inputting, instead of the control current instruction value generated by the control unit, the inspection current instruction value forming the inspection instruction value sequence to the current DA converter;
detecting an inspection current value of an inspection current that is outputted from the current DA converter; and
detecting the failure of the current DA converter from an inspection current value sequence in which the detected inspection current values are arranged in order of detection.

6. The method of detecting failure of the sensor system as claimed in claim 5, wherein
the generated inspection instruction value sequence is a sequence of the inspection current instruction value changing by 1 LSB in order within a range of the inspection current instruction value that can be inputted to the current DA converter.

7. The method of detecting failure of the sensor system as claimed in claim 6, wherein
the sensor system has an AD converter configured to sequentially convert a sensor voltage produced between sensor output terminals of the sensor element into a sensor voltage value,
the control unit has a PID operating unit configured to generate the control current instruction value by a PID operation using the sensor voltage value, and the method further comprising:
setting a coefficient Pc of a P-term and a coefficient Dc of a D-term of the PID operation to 0, and also setting a coefficient Ic of an I-term of the PID operation to such magnitude that the inspection current instruction value changing by 1 LSB in order is outputted from the PID operating unit; and
inputting a predetermined input constant value, instead of the sensor voltage value, to the PID operating unit of the control unit, and generating the inspection instruction value sequence in the PID operating unit.

8. The method of detecting failure of the sensor system as claimed in claim 5, wherein
the sensor system has the sensor element to which the control current is inputted.

* * * * *